United States Patent [19]

Hayes, Jr.

[11] Patent Number: 4,514,732
[45] Date of Patent: Apr. 30, 1985

[54] TECHNIQUE FOR INCREASING BATTERY LIFE IN REMOTE CONTROL TRANSMITTERS

[75] Inventor: John J. Hayes, Jr., Chesapeake, Va.

[73] Assignee: General Electric Company, Portsmouth, Va.

[21] Appl. No.: 410,200

[22] Filed: Aug. 23, 1982

[51] Int. Cl.³ .......................... H04B 9/00; H04Q 9/00
[52] U.S. Cl. .................... 340/825.57; 358/194.1; 455/603
[58] Field of Search ............ 340/825.57, 825.56, 340/365 R, 365 S, 825.22; 358/194.1; 455/95, 603

[56] References Cited

U.S. PATENT DOCUMENTS

| | | |
|---|---|---|
| 3,325,593 | 6/1967 | Platt et al. |
| 3,748,645 | 7/1973 | Kawashima |
| 3,940,701 | 2/1976 | Novitski |
| 4,034,300 | 7/1977 | Streckenbach |
| 4,081,623 | 3/1978 | Vogeley |
| 4,127,876 | 11/1978 | Schwartz |
| 4,156,810 | 5/1979 | Igarashi |
| 4,169,226 | 9/1979 | Fukuji |
| 4,246,611 | 1/1981 | Davies ........................ 358/194.1 |
| 4,264,982 | 4/1981 | Sakarya |
| 4,357,849 | 11/1982 | Ezawa et al. ................. 340/365 S |
| 4,412,218 | 10/1983 | Niitsu ........................ 340/825.56 |

OTHER PUBLICATIONS

Components Report XI, (1976), No. 5, p. 150.
Practical Electronics, Feb. 1982, pp. 32-34, vol. 18, No. 2, S2084-0014.
National Technical Report, vol. 26, No. 2, Apr. 1980, S0474-0091, pp. 269-272, Matsunaga et al.

Primary Examiner—Donald J. Yusko

[57] ABSTRACT

Remote control of TV receivers, disc players and video cassette recorders (VCRs) involves controlling functions that are continuous, such as volume or brightness control. The selected function is increased or decreased as long as the user continues to depress the appropriate key on the transmitter. Typically, a signal is transmitted for as long as the key remains depressed, but this can significantly shorten transmitter battery life. To increase battery life, a burst of data is transmitted to identify the command when a continuous function key is initially depressed. The remote receiver, upon receiving this command, begins to increase or decrease the appropriate function. After the initial burst of data is issued by the transmitter, no additional signals are transmitted as long as the key remains depressed. During this time, the remote receiver continues to increase or decrease the selected function. When the transmitter key is released, a second burst of data is transmitted to instruct the remote receiver to cease changing the selected function. Thus, a function which appears to be continuous to the user is accomplished by issuing only two commands, regardless of the length of time the key remains depressed. This technique substantially reduces battery capacity consumed for the control of continuous functions.

7 Claims, 7 Drawing Figures

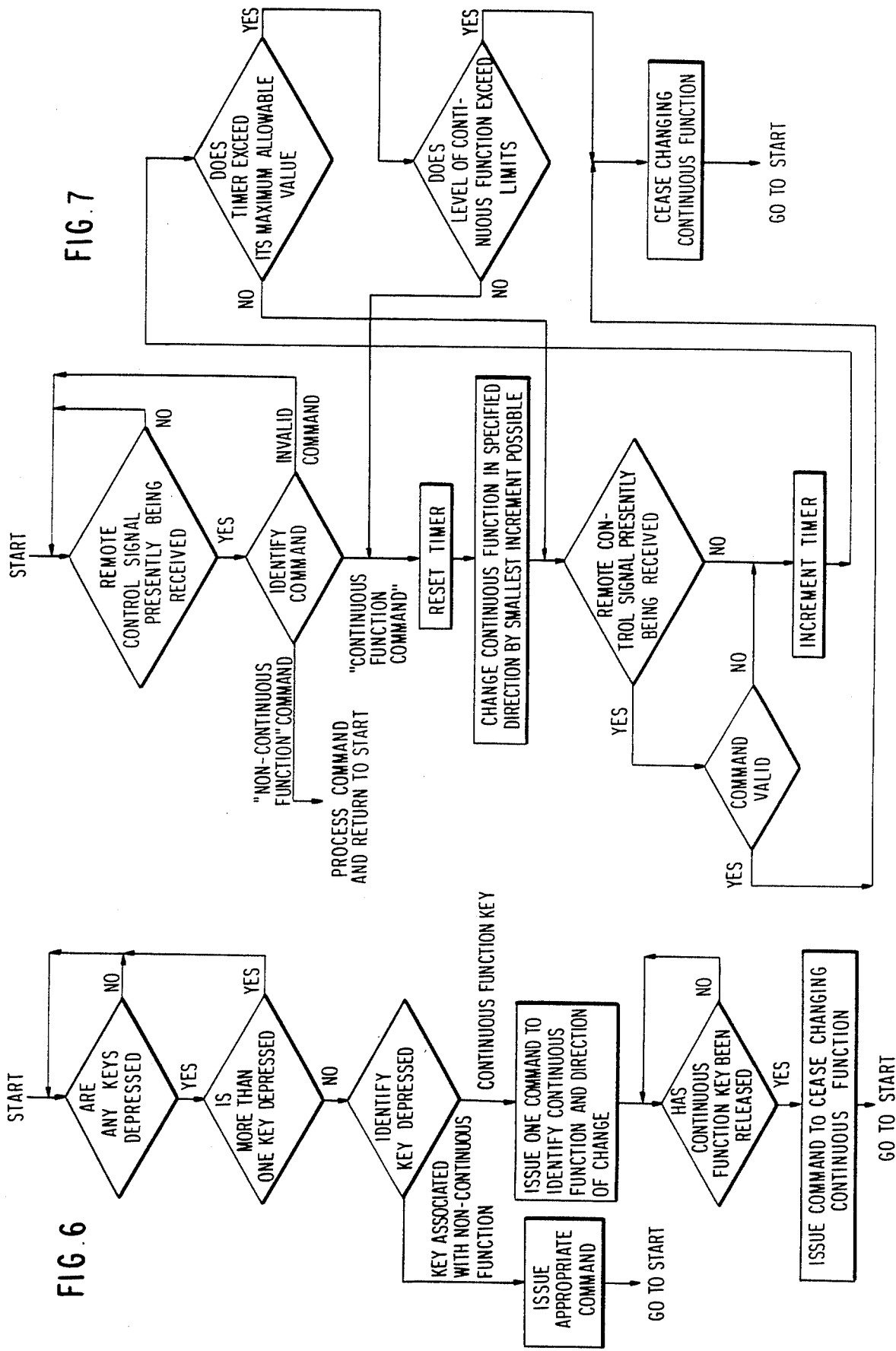

TECHNIQUE FOR INCREASING BATTERY LIFE IN REMOTE CONTROL TRANSMITTERS

BACKGROUND OF THE INVENTION

The present invention generally relates to remote control systems of the type used to control TV receivers, disc players and video cassette recorders (VCRs), and more particularly to a technique for significantly increasing the battery life in the transmitters of such remote control systems.

Wireless remote control of television receivers, disc players and VCRs typically involves the transmission of an infrared or ultrasonic signal from a battery-powered transmitter. Infrared control systems are less susceptible to interference signals than are ultrasonic control systems, but there is some concern that the human eye may be harmed when subjected to continuous direct exposure to infrared radiation. In either type of system, certain continuous functions, such as volume or brightness, must be controlled. In practice, the selected function is increased or decreased as long as the user continues to depress the appropriate key on the transmitter. In some prior art systems, a signal is transmitted for as long as the key remains depressed. This not only increases the potential harm to the human eye that may be inadvertently subjected to continuous direct exposure from an infrared transmitter, but in both the infrared and ultrasonic systems, battery life is significantly decreased.

A typical example of an infrared remote control transmitter employs the NEC μPD1913C integrated circuit (IC). FIG. 1 illustrates the manner in which this transmitter IC operates the infrared (IR) light emitting diode (LED) to control continuous functions. A command identifying the nature of the continuous function and the direction of change is conveyed on the initial 67.5 msec. of transmission. The command is followed by a pair of pulses (one 9 msec. pulse and one 0.56 msec. pulse) occurring every 108 msec. for as long as the continuous function key remains depressed. The remote receiver changes the continuous function until it no longer receives these pulses. Thus, as shown in FIG. 1, the portion of the signal that conveys command information (the first 67.5 msec. of transmission) consists of a 9 msec. leader pulse followed by thirty-three 0.56 msec. pulses. Each 9 msec. and 0.56 msec. pulse consists of a series of shorter-duration pulses occurring at a rate defined by the carrier signal. The carrier signal turns the LED on 8.77 μsec. in each 26.3 μsec. which is a 33% duty cycle.

The total time the LED is on when a single 67.5 msec. command is transmitted is $$t_1 = 0.33 \, [9 \text{ msec.} + 33 \, (.56 \text{ msec})] = 9.07 \text{ msec.}$$

| 33% Duty Cycle | 9 msec. Leader | Thirty-three .56 msec. Pulses |
|---|---|---|

Assuming a continuous function key is depressed for T seconds, the total on time for the LED is $$t_c = t_1 + .33 \left[ \frac{(9 \text{ msec.} + .56 \text{ msec.})}{108 \text{ msec.}} \right] T(1000)$$

| On time for 1 command | 33% Duty Cycle | 9 msec. & .56 msec. Pulse every 108 msec. | Key Depression Time in msec. |
|---|---|---|---|

Although transmitter ICs available from other manufacturers use different modulation schemes, carrier frequencies and data formats, all known remote transmitters continue to transmit a signal in some fashion to accomplish the control of continuous functions. As a result, extensive use of continuous functions can significantly shorten battery life.

SUMMARY OF THE INVENTION

It is therefore an object of the present invention to provide a new technique for controlling a continuous remote control function wherein the transmission time is independent of the time the continuous function key is depressed.

It is another object of the invention to provide a battery powered transmitter for controlling a continuous remote control function without the consequent consumption of battery capacity experienced by prior art cordless transmitters when controlling continuous functions.

It is a further more specific object of the invention to provide a remote control transmitter for controlling continuous functions in TV receivers, disc players, VCRs and the like wherein the energy of the battery powering the transmitter is conserved in the process of controlling the continuous functions.

According to the invention, the remote control transmitter includes a keyboard and a microprocessor. The microprocessor continuously scans the keyboard to detect key closures. When the microprocessor detects a valid key closure, it identifies the key and determines the appropriate code to be transmitted. In the case where a continuous function key is depressed, a single command of pre-defined duration is transmitted. This command directs the remote receiver, which also includes a microprocessor, to begin changing the selected function at a rate determined by logic in the remote receiver. After the initial command has been issued, no signal transmission occurs as long as the user continues to depress the continuous function key. During this time, the remote receiver continues to change the selected function. Immediately after the user releases the continuous function key, a second command of pre-defined duration is issued by the transmitter. This command directs the remote receiver to cease changing the selected continuous function, and to maintain the level achieved when the function ceased changing. Using this technique, the total time the LED in an IR system would be on is simply the total on time for the two commands. In a specific example, $t_c' = 2(t_1) = 18.14$ msec. Since no IR signals are transmitted between turn on and turn off bursts, energy is conserved thereby extending battery life in cordless transmitters.

BRIEF DESCRIPTION OF THE DRAWINGS

The specific nature of the invention, as well as other objects, aspects, uses and advantages thereof, will clearly appear from the following description and from the accompanying drawings, in which:

FIG. 6 is a flow diagram of the program of the transmitter microprocessor; and

FIG. 7 is a flow diagram of the program of the receiver microprocessor.

DESCRIPTION OF THE PREFERRED EMBODIMENT

Figure 1:
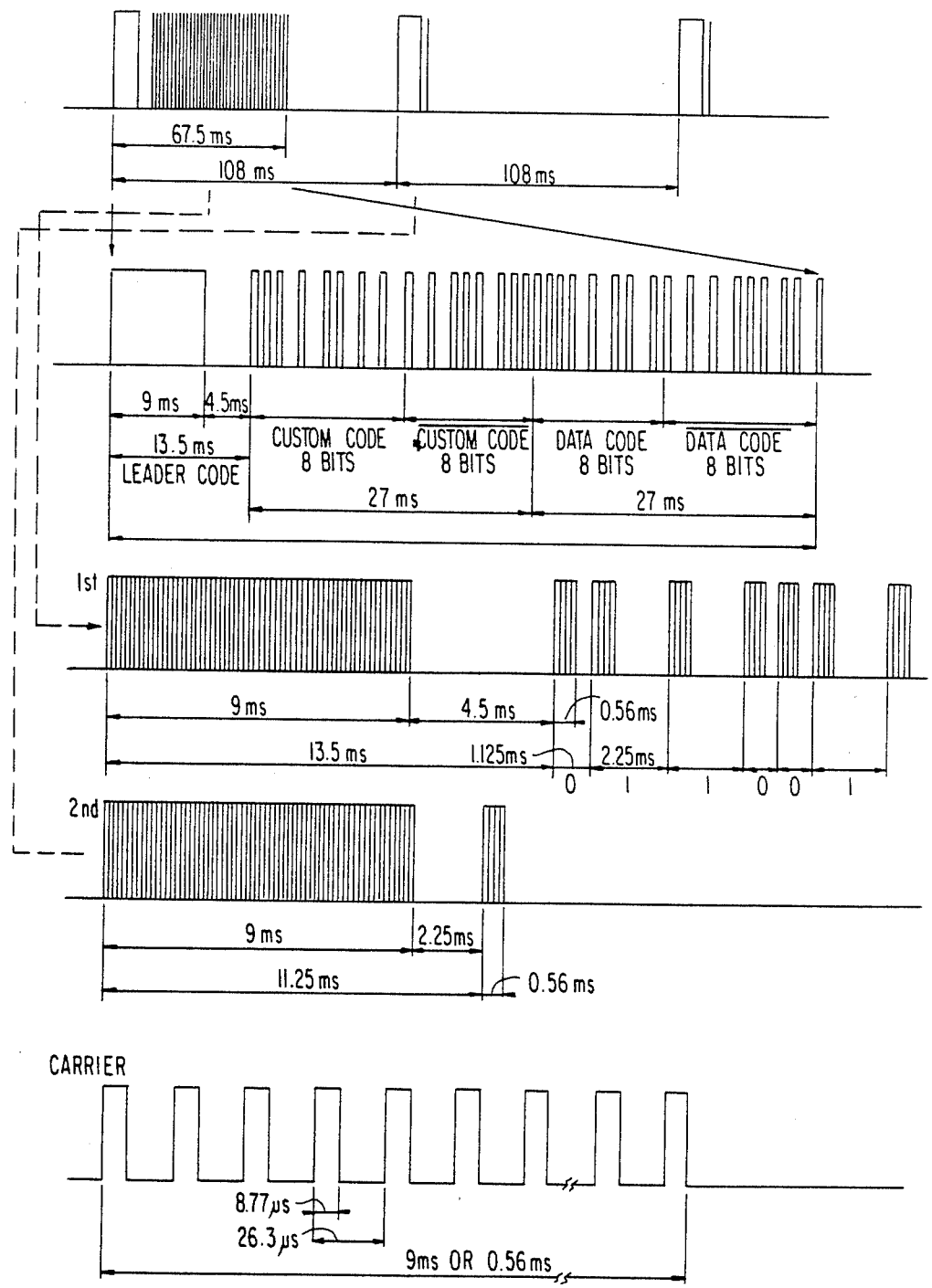
FIG. 1 is a timing diagram of a typical prior art remote control transmission for controlling a continuous function.
Figure 2:
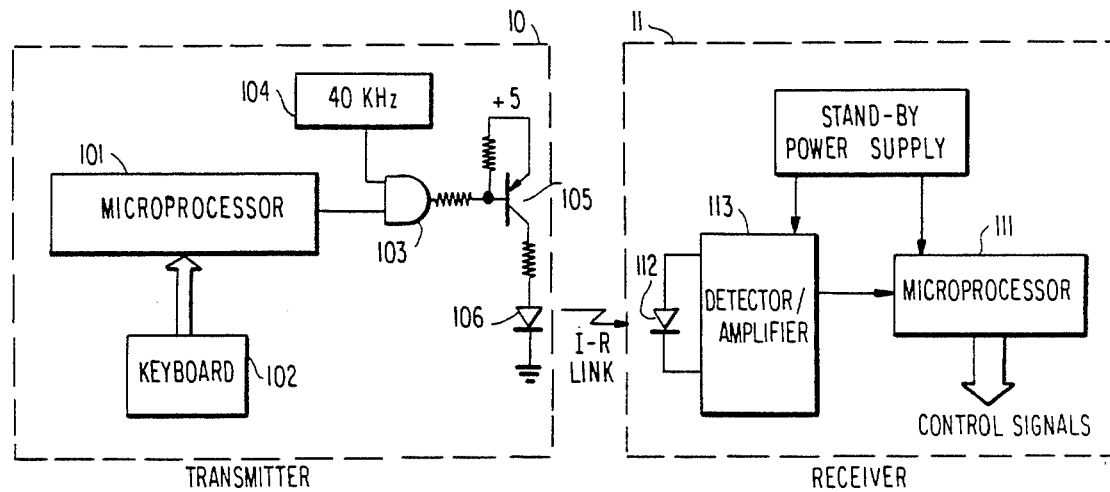
FIGURE 2 is a block diagram of a remote control transmitter and receiver system which is capable of using the technique according to the present invention.

An example of a remote control transmitting and receiving system is shown in FIG. 2. The transmitter consists of a microprocessor 101, a keyboard 102, an AND gate 103, a forty KHz source 104, and an output transistor 105 that drives an IR LED 106. The keyboard is accessible to the user, and the user depresses the appropriate key on the keyboard to transmit the desired command to the remote receiver 11. The microprocessor 101 continuously scans the keyboard 102 to detect key closures. When the microprocessor 101 detects a valid key closure, it identifies the key and determines the appropriate code to be transmitted over the IR link. A serial output from the microprocessor 101 gates the forty KHz carrier frequency to the IR LED 106 in a predefined pattern for a pre-defined duration to convey to the receiver 11 information that identifies the command.

Figure 3:
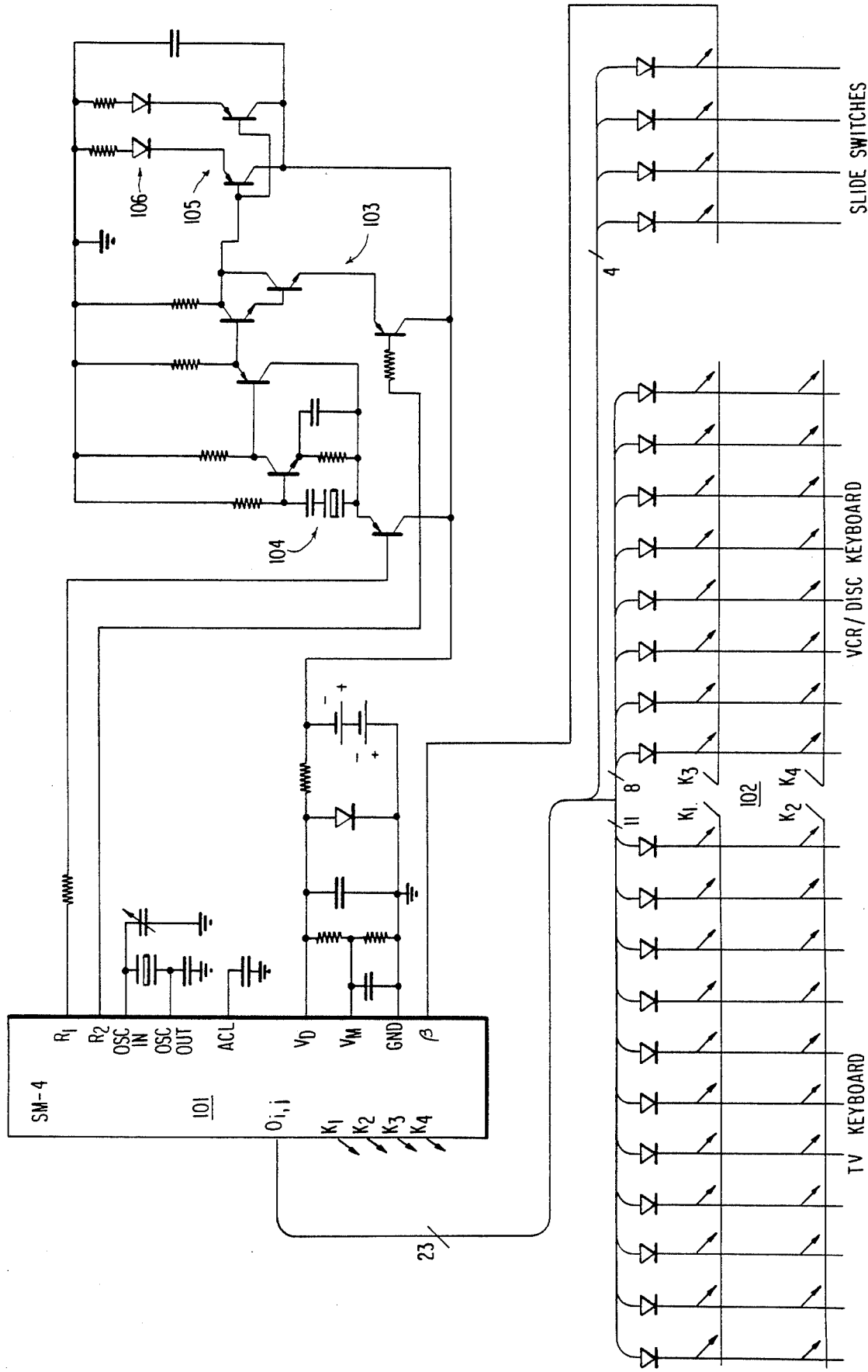
FIG. 3 is a more detailed block and schematic diagram of the transmitter of FIG. 2 according to a specific preferred embodiment.

FIG. 3 is a more detailed block and schematic diagram of the transmitter 10 shown in FIG. 2. In the embodiment shown in FIG. 3, the microprocessor is a model SM-4 manufactured by the Sharp Corporation. The keyboard 102 is divided into three sections; one for the TV, one for the VCR/disc, and one for various slide switches. Each section is composed of a matrix of pushbutton switches, the columns of the matrices being scanned by the output $O_{ij}$ from the microprocessor 101. A signal on any one of the row lines $K_1$, $K_2$, $K_3$, $K_4$, and $\beta$ is used to detect a key closure.

Figure 4:
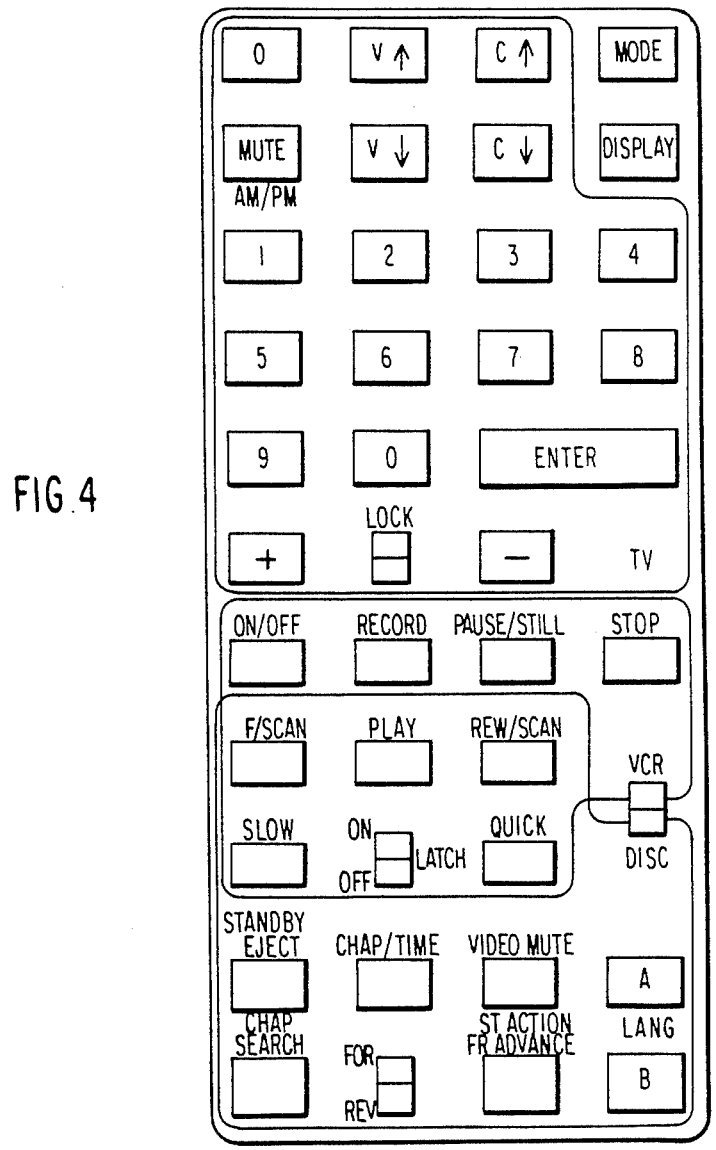
FIG. 4 is a plan view of an example of a keyboard configuration that may be used in the transmitter of FIG. 3.

An example of a possible configuration of the keyboard 102 is shown in FIG. 4. The upper part of this keyboard is for TV controls. One of these controls is a continuous function, namely volume which is designated by the keys V ↑ and V ↓ . The lower portion of the keyboard controls VCR and disc functions. Continuous-type functions controlled on this keyboard are indicated by the keys FF/SCAN, REW/SCAN, SLOW, and QUICK. While these functions do not necessarily increase or decrease continuously while the corresponding key is depressed, these functions may be considered continuous-type functions because they are maintained as long as the corresponding key is depressed.

Returning now to FIG. 2, a second microprocessor 111 is employed in the remote receiver 11. This microprocessor is not necessarily the same type as that used in the transmitter 10. IR energy is converted into an electrical signal by divide 112. The electrical signal is detected and amplified by detection/amplifier 113 and processed by the microprocessor 111 to identify the command that was transmitted.

Figure 5:
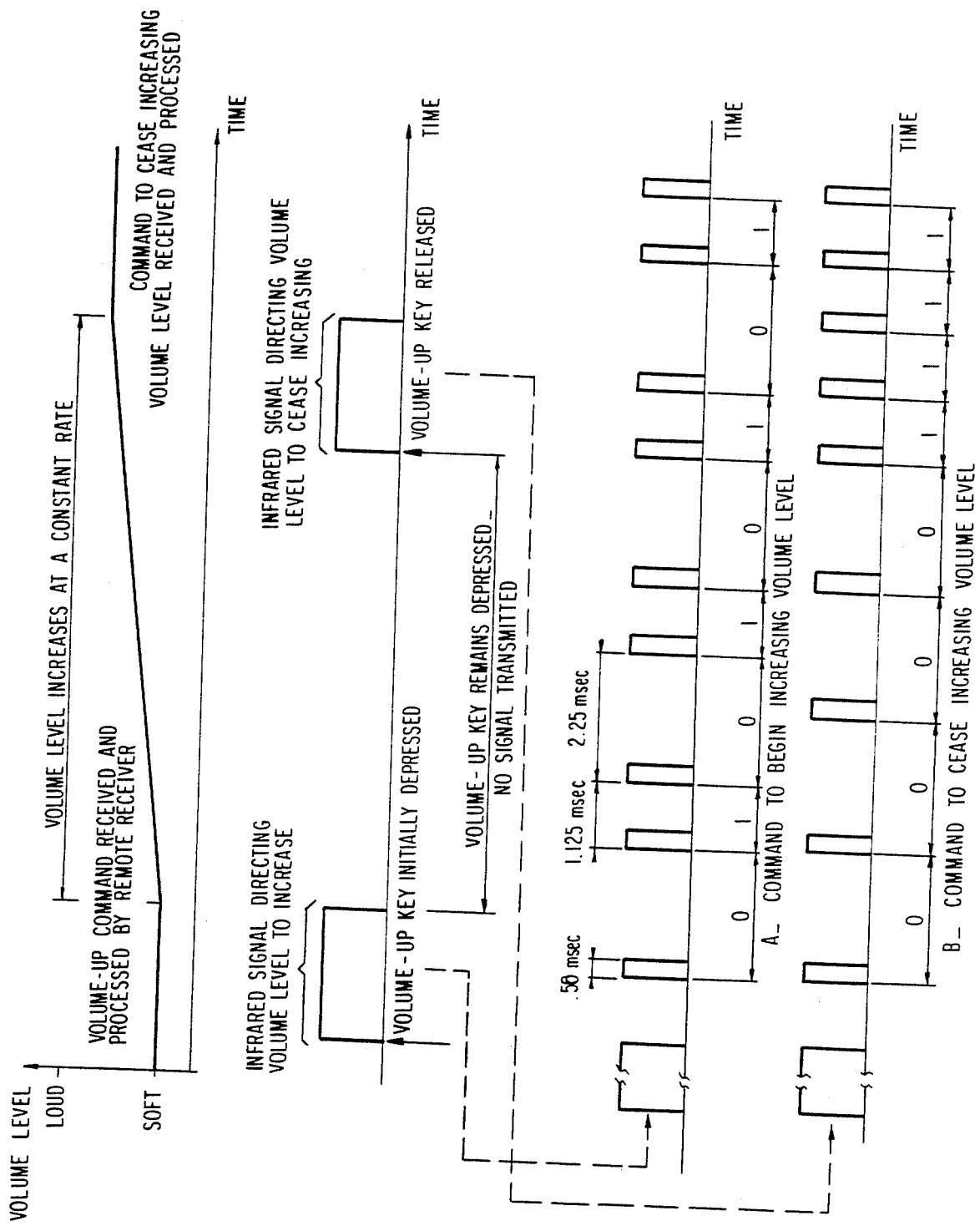
FIG. 5 is a timing diagram of an example of a remote control transmission for controlling a continuous function according to the invention.

According to the invention, when a continuous function key is initially depressed, a single command of a pre-defined duration is transmitted. This command directs the remote receiver to begin changing the selected function at a rate determined by logic in the remote receiver. After the initial command has been issued, no signal transmission occurs as long as the user continues to depress the continuous function key. During this time, the remote receiver continues to change the selected function. Immediately after the user releases the continuous function key, a command of pre-defined duration is issued by the transmitter. This command directs the remote receiver to cease changing the selected continuous function, and to maintain the level achieved when the function ceased changing. This operation is illustrated by the timing diagram of FIG. 5. Assume a code consisting of eight binary digits, with value 01010101, is used to direct the television receiver to begin increasing the volume level. Also assume that a binary code having the value 00001111 is used to direct the remote receiver to cease changing the volume level. FIG. 5 illustrates the signals transmitted to control the volume level. A 9 msec. burst of carrier is initially transmitted to alert the remote receiver that transmission of data is eminent. The binary codes are conveyed by a series of pulses, each having a duration of 0.56 msec. A binary digit equaling 1 is conveyed when the time between leading edges of two adjacent pulses is 1.125 msec. A binary digit of 0 is conveyed when the time between leading edges of two adjacent pulses is 2.25 msec.

Turning now to FIG. 6, the flow diagram of the program for the microprocessor 101 in the transmitter 10 is illustrated. The microprocessor 101 continuously scans the keyboard 102 to determine if any keys are depressed. Thus, the first decision block in the flow diagram is to determine whether keys have been depressed. If keys have been depressed, then the next decision block in the flow diagram is to determine whether more than one key has been depressed. If more than one key has been depressed, the microprocessor will ignore the keyboard entry. Assuming that only a single key has been depressed, the microprocessor identifies which key has been depressed. If the key depressed is a non-continuous key, such as a key to turn the television receiver off, the microprocessor simply issues the appropriate command which is transmitted to the remote receiver 11. The program then returns to start. If, on the other hand, a continuous function key such as volume has been depressed, the microprocessor 101 issues a single command to identify the continuous function and the direction of change as indicated in FIG. 5. No further action is taken by the microprocessor 101 until the continuous function key has been released. At that time, the microprocessor 101 issues a command to cease changing the continuous function as illustrated in FIG. 5. Thereafter, the microprocessor program returns to start.

The microprocessor 111 in the remote receiver is provided with a program illustrated by the flow diagram in FIG. 7. This program begins by a periodic check to determine whether a remote control signal is being received by the diode 112. If such a signal is being received, microprocessor 111 identifies the command as either being an invalid command, a non-continuous function command or a continuous function command. If the command is an invalid command, the microprocessor 111 returns to start and ignores the signal that was received. If the command is a non-continuous function command, such as a command to turn the television off, the microprocessor then proceeds to process that command in the usual manner. If, however, the command is a continuous function command, the microprocessor 111 resets its internal timer and begins to change the continuous function in the specified direction by a unit increment. As long as no further remote control signal is received, the microprocessor 111 continues to increment its internal timer. With each increment of the internal timer, the microprocessor checks the content of the timer to determine whether it has exceeded its maximum allowable value. If the maximum allowable value of the timer is exceeded, then the microprocessor 111 also checks to determine whether the continuous function exceeds its limits. If not, then the microprocessor 111 resets the timer and changes the continuous function by a unit increment in the appropriate direction. If during the time that the continuous function is being changed a remote control signal is received, the microprocessor checks to determine whether the command received is valid. In the case illustrated in FIG. 5, the valid command is the binary value 00001111. Thus, if this command is received, then the microprocessor 111 ceases to change the continuous function and the program returns to start. Notice also that if the level of the continuous function exceeds predefined limits, then the microprocessor 111 also will cease to change the continuous function and the program returns to start.

Assuming no invalid commands are received, the rate of change of the continuous function, as perceived by a user, depends upon the rate at which microprocessor 111 increments the internal timer, the maximum value the timer can assume, and the magnitude of the unit increment change made in the continuous function each time the timer reaches its maximum value. If an invalid command is received, the rate of change of the continuous function will decrease due to the time required to determine that the received command is invalid.

I claim:

1. A remote control system for controlling continuous functions comprising:

a transmitter including at least one continuous function command key, the operation of which causes said continuous function to be adjusted, and code transmitting means responsive to the initial operation of said continuous function command key for transmitting a first code burst and responsive to the cessation of the operation of said continuous function command key for transmitting a second code burst, the transmission of said code transmitting means consisting only of said first code burst and said second code burst, and a receiver responsive to said first code burst for causing the corresponding continuous function to be adjusted at a predetermined rate and responsive to said second code burst for causing the adjustment of said continuous function to cease.

2. A remote control system as recited in claim 1 wherein said first code burst and said second code burst are different from each other and said transmitter further comprises:

a keyboard including both non-continuous and continuous function command keys, and a microprocessor which continuously scans said keyboard to determine whether one of said function command keys has been depressed and, if one of such keys has been depressed, generating a code identifying the commanded function.

3. A remote control system as recited in claims 1 or 2 wherein said continuous function can be adjusted in either one of two directions and said first code burst identifies both the continuous function and the direction of adjustment.

4. A remote control system as recited in claim 2 wherein said transmitter includes a battery for supplying power thereto, the energy of said battery being conserved by not transmitting signals between said first and second code bursts.

5. A remote control system as recited in claim 3 wherein said transmitter includes a battery for supplying power thereto, the energy of said battery being conserved by not transmitting signals between said first and second code bursts.

6. A method of operating a remote control system for controlling continuous functions, said remote control system including a transmitter having at least one continuous function command key and a receiver responsive to a transmission from said transmitter produced by operating said continuous function command key for adjusting said continuous function, said method consisting of the steps of transmitting a first code burst upon the initial operation of said continuous function command key, receiving said first code burst and beginning the adjustment of said continuous function at a predetermined rate, transmitting a second code burst upon the cessation of the operation of said continuous function command key, and receiving said second code burst and stopping the adjustment of said continuous function.

7. A method of operating a remote control system as recited in claim 6 wherein said continuous function can be adjusted in either one of two directions and the first recited step of transmitting includes the transmission in said first code burst both the identification of the continuous function to be adjusted and the direction of adjustment.

* * * * *